(12) United States Patent
Wilson

(10) Patent No.: US 9,837,145 B2
(45) Date of Patent: Dec. 5, 2017

(54) MULTI-LEVEL FLASH STORAGE DEVICE WITH MINIMAL READ LATENCY

(71) Applicant: Avago Technologies General IP (Singapore) Pte. Ltd., Singapore (SG)

(72) Inventor: Bruce Alexander Wilson, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/839,535

(22) Filed: Aug. 28, 2015

(65) Prior Publication Data
US 2017/0062045 A1   Mar. 2, 2017

(51) Int. Cl.
G11C 11/34    (2006.01)
G11C 11/56    (2006.01)
G11C 16/26    (2006.01)

(52) U.S. Cl.
CPC .......... *G11C 11/5642* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 7,420,841 B2 * | 9/2008 | Ruf | G06F 11/1072 365/185.03 |
| 9,019,770 B2 | 4/2015 | Lin et al. | |
| 9,245,630 B2 * | 1/2016 | Kwak | G11C 16/10 |
| 2009/0287975 A1 * | 11/2009 | Kim | G06F 11/1072 714/746 |
| 2014/0006688 A1 | 1/2014 | Yu et al. | |
| 2014/0059406 A1 * | 2/2014 | Hyun | G11C 11/5621 714/773 |
| 2015/0006791 A1 * | 1/2015 | Yoo | G11C 16/10 711/103 |
| 2015/0205664 A1 * | 7/2015 | Janik | G06F 11/1012 714/764 |
| 2016/0274969 A1 * | 9/2016 | Chen | H03M 13/45 |

* cited by examiner

*Primary Examiner* — Harry W Byrne
*Assistant Examiner* — Sultana Begum
(74) *Attorney, Agent, or Firm* — Sheridan Ross P.C.

(57) ABSTRACT

A memory system, non-volatile solid-state memory, and a method of efficiently reading data from a flash memory array are disclosed. The disclosed memory system includes a flash memory array having a plurality of memory cells that store data therein, each of the plurality of memory cells being configured to store at least two bits per cell and being organized into pages, and a controller configured to read any bit of data from a page of the flash memory array by applying a single threshold voltage to the flash memory array. Reading data from the flash memory array with a single threshold greatly decreases the latency associated with the read operation.

20 Claims, 7 Drawing Sheets

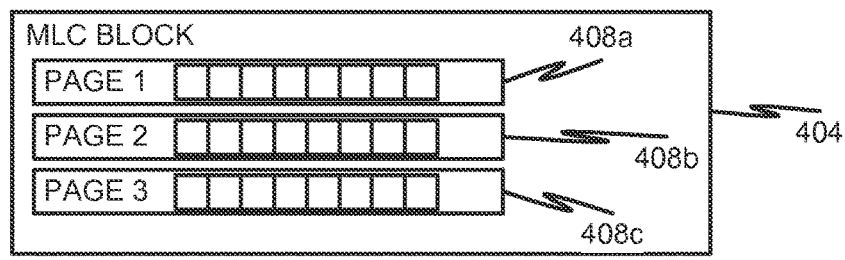
FIG. 4A
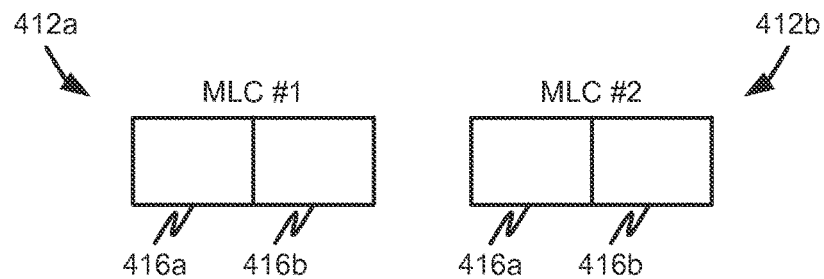
FIG. 4B
| P1 | P2 | P3 | MEDIA | T1 | T2 | T3 |
|----|----|----|-------|----|----|----|
| 0  | 0  | 0  | CB    | 00 | 01 | 11 |
| 0  | 0  | 1  | DB    | 00 | 01 | 01 |
| 0  | 1  | 0  | BC    | 00 | 10 | 11 |
| 0  | 1  | 1  | BD    | 00 | 10 | 10 |
| 1  | 0  | 0  | CA    | 01 | 01 | 11 |
| 1  | 0  | 1  | DA    | 01 | 01 | 01 |
| 1  | 1  | 0  | AC    | 10 | 10 | 11 |
| 1  | 1  | 1  | AD    | 10 | 10 | 10 |
FIG. 4C
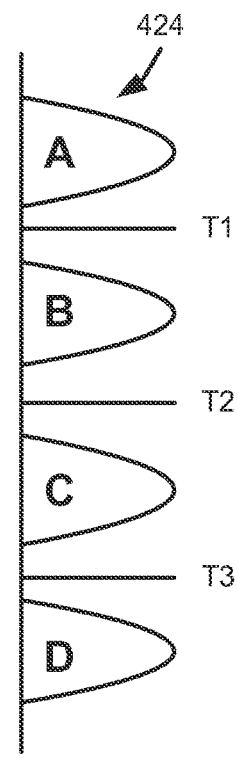
FIG. 4D

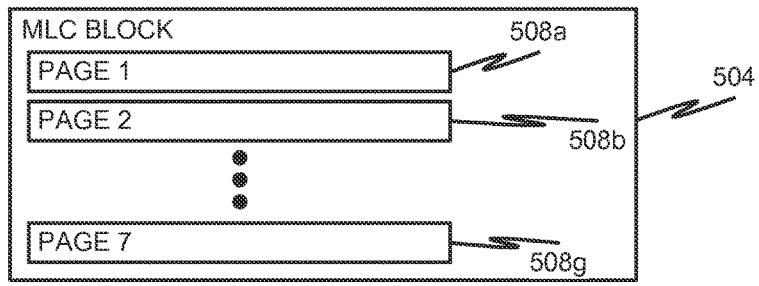
*FIG. 5A*
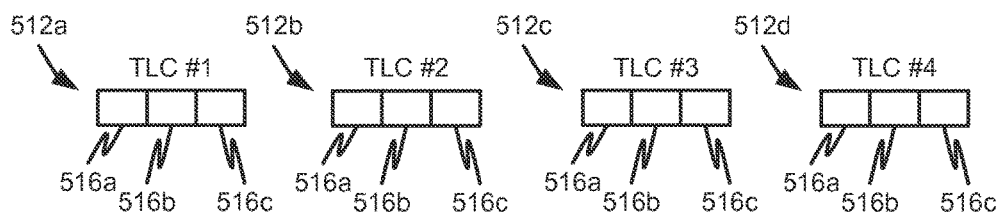
*FIG. 5B*
| user data | media | T1 | T2 | T3 | T4 | T5 | T6 | T7 |
|---|---|---|---|---|---|---|---|---|
| '00000000 | 'AECG | '0000 | '0001 | '0001 | '0101 | '0101 | '0111 | '0111 |
| '00000001 | 'BECG | '0000 | '0001 | '0001 | '0101 | '0101 | '0111 | '1111 |
| '00000010 | 'CEAG | '0000 | '0001 | '0001 | '0101 | '0101 | '1101 | '1101 |
| '00000011 | 'CEBG | '0000 | '0001 | '0001 | '0101 | '0101 | '1101 | '1111 |
| '00000100 | 'AEDG | '0000 | '0001 | '0001 | '0101 | '0111 | '0111 | '0111 |
| '00000101 | 'BEDG | '0000 | '0001 | '0001 | '0101 | '0111 | '0111 | '1111 |
| '00000110 | 'DEAG | '0000 | '0001 | '0001 | '0101 | '1101 | '1101 | '1101 |
| '00000111 | 'DEBG | '0000 | '0001 | '0001 | '0101 | '1101 | '1101 | '1111 |
| '00001000 | 'AEGC | '0000 | '0010 | '0010 | '0110 | '0110 | '0111 | '0111 |
| '00001001 | 'BEGC | '0000 | '0010 | '0010 | '0110 | '0110 | '0111 | '1111 |
520
*FIG. 5C*

MULTI-LEVEL FLASH STORAGE DEVICE WITH MINIMAL READ LATENCY

FIELD OF THE DISCLOSURE

The present disclosure is generally directed toward memory devices and, in particular, toward flash memory devices.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block having multiple pages. Each page comprises multiple cells. Each cell is capable of storing an electric charge. Cells can be used for storing data bits or for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Quad-Level-Cell (QLC) flash memories store four binary bits per physical cell, and have sixteen possible logic states and 16 voltage levels. Other flash types may have more binary bits per memory cell. Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

SLC flash technologies usually have a low read latency (e.g., time between a host sending a read command and eventually receiving the requested data) whereas MLC, TLC, and QLC flash technologies have higher read latencies due to the need to apply multiple voltage thresholds. The tradeoff of increased read latency is usually acceptable due to the increased memory density offered by the MLC, TLC, and QLC flash technologies as compared to SLC flash technologies. Unfortunately, more applications, such as enterprise data storage and cache flash appliances, are becoming more sensitive to read latency, but still require the lower price point associated with the MLC, TLC, and QLC flash technologies. If flash memory is to find a place in these types of applications, the read latency of the flash technologies needs to be improved.

BRIEF DESCRIPTION OF THE DRAWINGS

The present disclosure is described in conjunction with the appended figures, which are not necessarily drawn to scale:

FIG. 4A is a block diagram depicting an MLC block in accordance with at least some embodiments of the present disclosure;

FIG. 4B is a block diagram depicting a pair of MLC flash cells in accordance with at least some embodiments of the present disclosure;

FIG. 4C is a table depicting read thresholds to be applied for reading data from the pair of MLC flash cells depicted in FIG. 4B in accordance with at least some embodiments of the present disclosure;

FIG. 4D is a plot of cell voltage distributions for reading data from a MLC flash memory device in accordance with at least some embodiments of the present disclosure;

FIG. 5A is a block diagram depicting an TLC block in accordance with at least some embodiments of the present disclosure;

FIG. 5B is a block diagram depicting a set of TLC flash cells in accordance with at least some embodiments of the present disclosure;

FIG. 5C is a table depicting read thresholds to be applied for reading data from the set of TLC flash cells depicted in FIG. 5B in accordance with at least some embodiments of the present disclosure;

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Although embodiments of the present disclosure will be described in connection with flash memory and, in particular, NAND flash memory, it should be appreciated that embodiments of the present disclosure are not so limited. In particular, embodiments disclosed herein can be utilized in NOR flash memory, other types of non-volatile solid-state memory, and the like. Indeed, any memory device or system in which decreased read latency is desired may benefit from the embodiments described herein.

Figure 1:
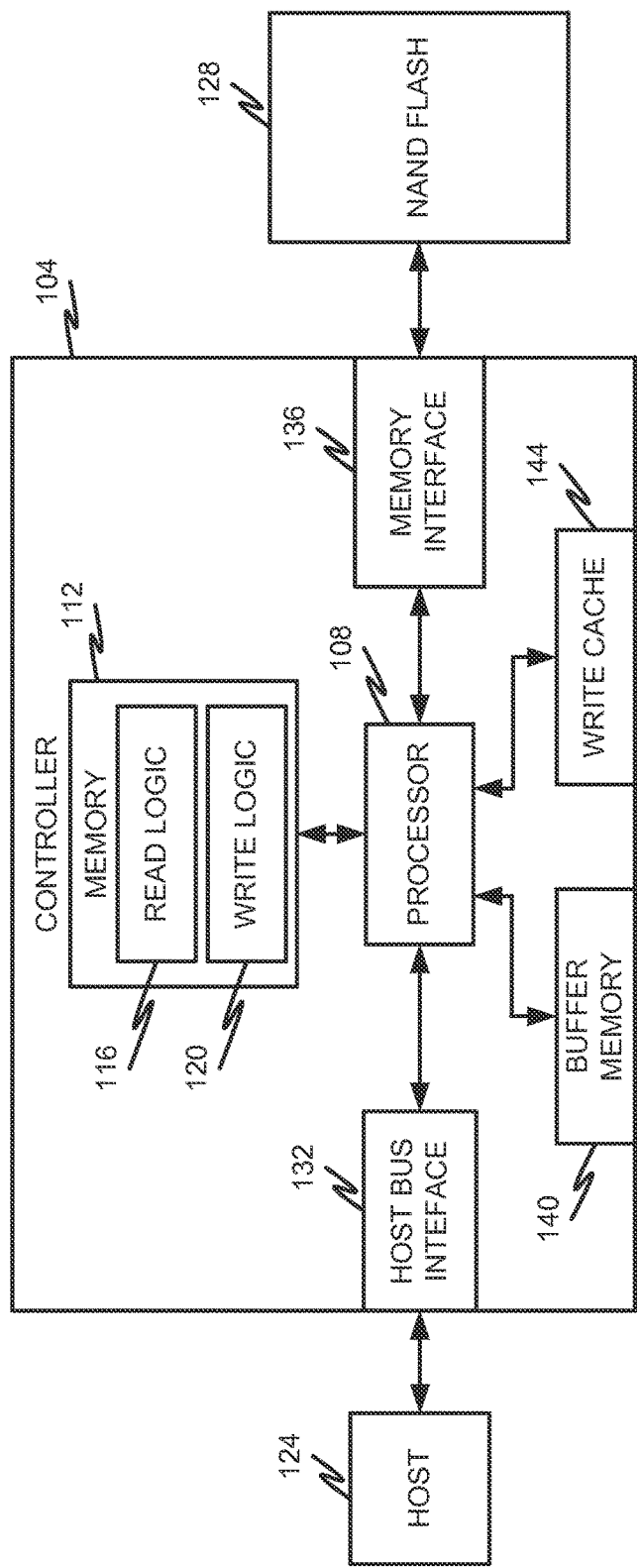
FIG. 1 is a block diagram depicting a memory system in accordance with at least some embodiments of the present disclosure.

With reference initially to FIG. 1, a memory system will be described in accordance with at least some embodiments of the present disclosure. The memory system is shown to include a controller 104, a host 124, and NAND flash memory 128. The controller 104 corresponds to one example of a device that may reside between a host 124 and NAND flash device 128.

The host 124 may correspond to a computer, a computer network, a server, or collection of servers that interact with the NAND flash device 128. The controller 104 and host 124 may interact with one another via a host bus, using any conventional communication protocol between the two.

The NAND flash device 128 may correspond to a solid-state memory device used for storing data with an electric charge applied to a transistor, set of transistors, or some other solid-state circuit component. The NAND flash device 128 may be replaced with a NOR flash device or some other type of memory device without departing from the scope of the present disclosure.

The controller 104 may correspond to any type of memory controller architecture used to provide an interface between the host 124 and NAND flash device 128. In some embodiments, the controller 104 comprises a processor 108, memory 112, a host bus interface 132, a memory interface 136, buffer memory 140, and a write cache 144.

The processor 108 may include any type of processing mechanism known in the art. Suitable examples of components that may be utilized as the processor 108 include, without limitation, microprocessors, central processing units, Integrated Circuit (IC) chips, digital processors, etc. In some embodiments, the processor 108 may execute the instructions stored in memory 112 to enable the functionality of the controller 104 described herein. In other embodiments, the processor 108 may correspond to an Application Specific Integrated Circuit (ASIC), in which case functionality of the instructions may be embedded in the processor 108.

The memory 112 is shown to include two sets of instructions, namely, read logic 116 and write logic 120. The instructions may be executed by the processor 108 to implement read requests and write requests received from the host 124. In some embodiments, the read logic 116, when executed by the processor 108, enables the controller 104 to read certain data from the NAND flash device 128 and return the read data to the host 124. Conversely, the write logic 120, when executed by the processor 108, enables the controller 104 to write data received from the host 124 to the NAND flash device 128.

The host bus interface 132 may correspond to the physical interconnection between the controller 104 and the bus that connects the host 124 and the controller 104. The nature of the host bus interface 132 will depend upon the type of interconnection between the host 124 and controller 104. In some embodiments, the host bus interface 132 may correspond to a serial or parallel computing interface that enables the transfer of data.

The memory interface 136 may correspond to the physical interconnection between the controller 104 and the NAND flash device 128. The memory interface 136 may include any number of circuits or drivers that enable the controller 104 to interact with the NAND flash device 128, retrieve data from the NAND flash device 128, and write data to the NAND flash device 128.

The buffer memory 140 may correspond to a particular type of memory used to temporarily store data that is read from the NAND flash device 128 prior to delivering the read data to the host 124. In some embodiments, the buffer memory 140 may by any type of conventional buffer memory, such as a static random access memory, dynamic random access memory, or the like.

The write cache 144 may correspond to a cache memory device used to temporarily store data before and as it is written to the NAND flash device 128. The write cache 144 be similar to the buffer memory 140 in that the write cache 144 may comprise high-speed static random access memory, although dynamic random access memory devices could also be used. The write cache 144 may store data being written to the NAND flash device 128 or metadata used during a write operation for the duration of a write process. Once a write process has completed, the write cache 144 may be cleared or rewritten with new data for another write process. As will be discussed in further detail herein, the controller 104 may utilize the write cache 144 in some embodiments to help facilitate an intelligent writing of data into the NAND flash device 128 such that the written data can be retrieved from the NAND flash device 128 in a relatively efficient manner. Even more specifically, the controller 104 may be configured to write data to the NAND flash device 128 such that a single voltage threshold can be applied to the NAND flash device 128 during a read operation, even though the data is stored in a multi-level NAND flash device 128 (e.g., an MLC, TLC, or QLC flash memory device).

Figure 2:
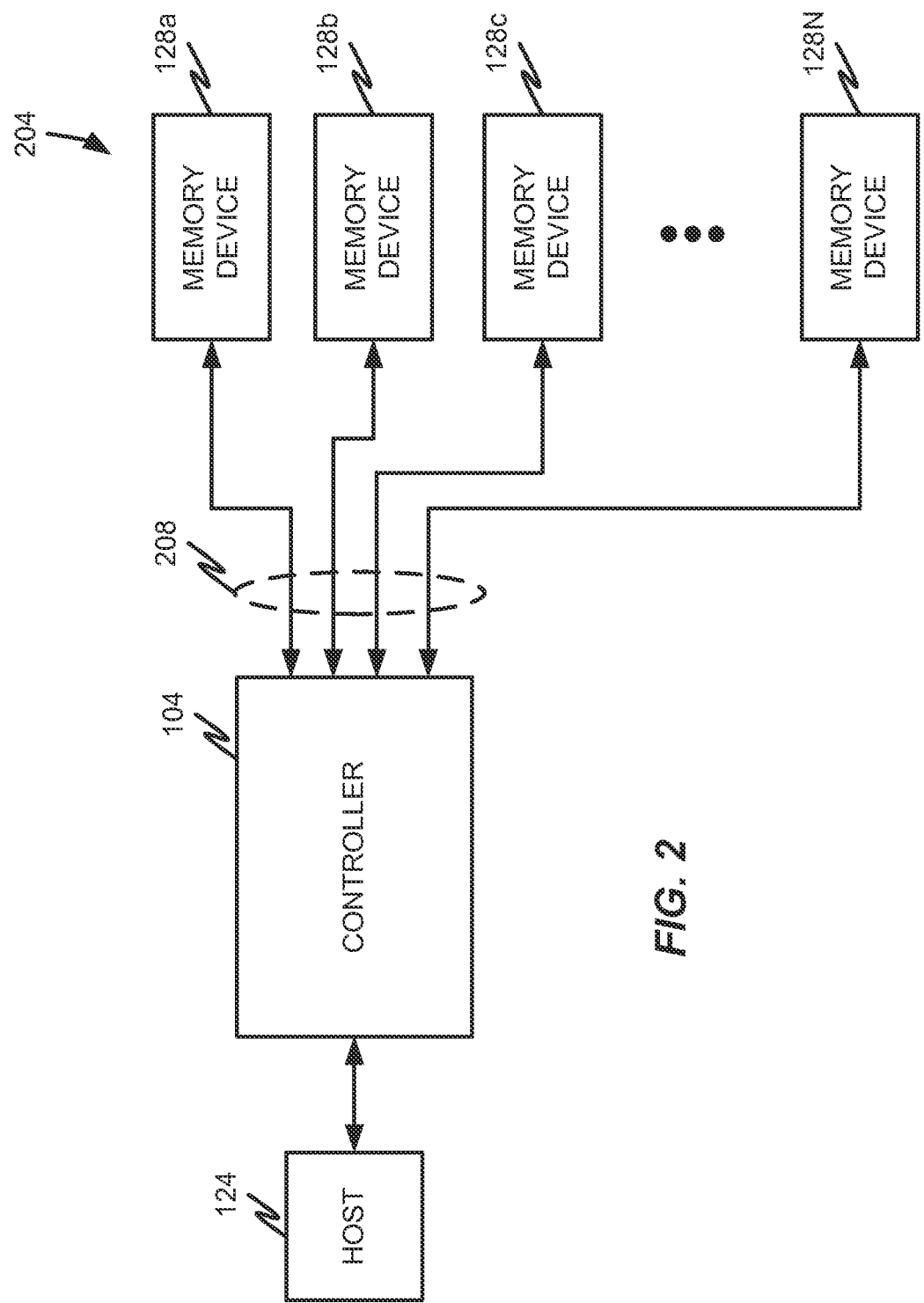
FIG. 2 is a block diagram depicting a memory system with a plurality of memory devices in accordance with at least some embodiments of the present disclosure.

With reference now to FIG. 2, additional details of the controller 104 will be described in accordance with at least some embodiments of the present disclosure. The controller 104 of FIG. 2 is shown as being connected to a plurality of memory devices 128a-N, which form a storage array 204. The number of memory devices, N, may be any integer value greater than one. In the depicted embodiment, a read channel 208 is provided between the controller 104 and the plurality of memory devices 128a-N. Accordingly, data may be written to any one of the memory devices 128a-N using the memory interface 136. Likewise, data may be read from any one of the memory devices 128a-N using the memory interface 136. The memory devices 128a-N may be of the same type (e.g., NAND flash devices, NOR flash devices, etc.) or they may be of varying types without departing from the scope of the present disclosure.

Figure 3:
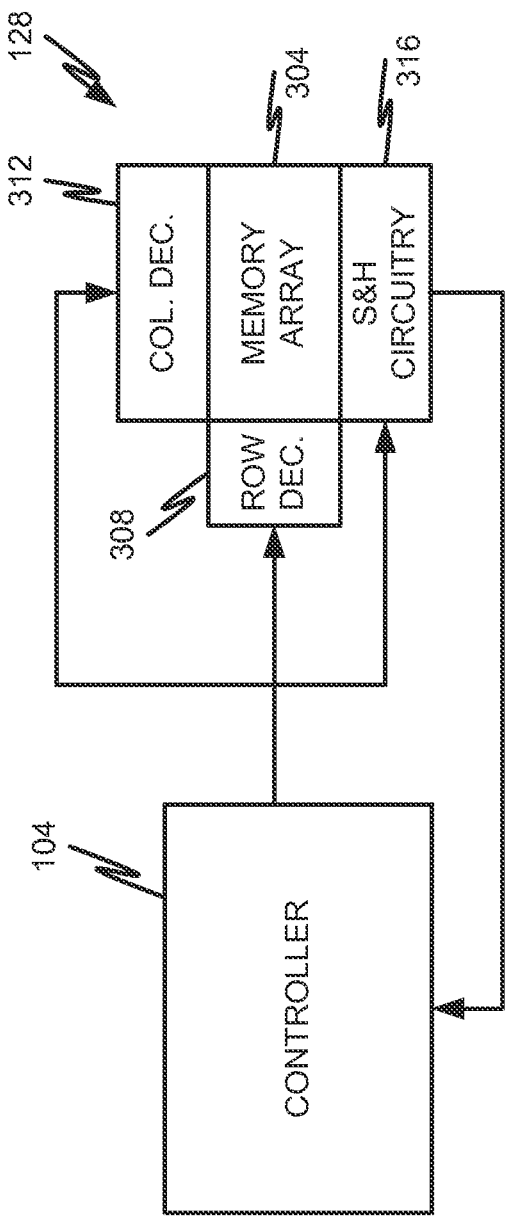
FIG. 3 is a block diagram depicting details of a memory device in accordance with at least some embodiments of the present disclosure.

With reference now to FIG. 3, additional details of a memory device 128 will be described in accordance with at least some embodiments of the present disclosure. The memory device 128 may correspond to the NAND flash device depicted in FIG. 1 or any other suitable type of solid-state memory device. In the depicted embodiment, the memory device 128 is shown to include a memory array 304, a row decoder 308, a column decoder 312, and sample and hold circuitry 316. The memory array 304 may correspond to physical data storage elements (e.g., transistors, switches, latches, etc.) capable of storing data in the form of an electrical charge or the like.

The data storage elements may be organized within the memory array 304 as a set of rows and a set of columns (e.g., an array). Each data storage element in the memory array 304 may be connected to the row decoder 308 and column decoder 312 such that instructions from the controller 104 can be transferred to the data storage elements in the memory array 304. In other words, the row decoder 308 and column decoder 312 may provide the physical circuitry that enables the controller 104 to write data to specific data elements by row and column addressing and to read data from specific data elements by row and column addressing. Instructions may be transferred from the controller 104 to the memory array 304 via the row decoder 308 and column decoder 312.

The sample and hold circuitry 316 may correspond to any type of known circuitry used to obtain requested data from the data storage elements in the memory array 304, hold those data values, and then provide the data values to the controller 104. In some embodiments, during a read operation, the controller 104 may apply a single threshold voltage to the memory array 304 and obtain data from the memory array 304 via the sample and hold circuitry 316. Specifically, as will be discussed in further detail herein, even though the memory array 304 may comprise a multi-level flash storage array (e.g., MLC, TLC, QLC flash array), the data may be encoded to the cells of the memory array 304 in a way that enables a single applied voltage to retrieve the data from the cells during a read operation. Even more specifically, the memory array 304 may be organized into pages and data may be read from any of the pages with the application of a single voltage threshold as compared to the multiple thresholds that are required to read data from a page of a multi-level flash storage device of the prior art. By using a single voltage threshold, the controller 104 is capable of reading data from the memory device 128 in a much more efficient manner (e.g., with less latency) than controllers of the prior art.

With reference now to FIGS. 4A-D, a memory device 128 utilizing MLC flash memory will be described in accordance with at least some embodiments of the present disclosure. The memory device 128 may comprise a plurality of MLC blocks 404, each of which comprise a number of pages 408a-c. The pages of each MLC block 404 may comprise eight bits each. Although the MLC block 404 of FIG. 4A is shown to include three pages 408a, 408b, 408c, it should be appreciated that a greater or lesser number of pages may be included in the block 404 without departing from the scope of the present disclosure.

As seen in FIG. 4B, an MLC cell 412 may comprise a first bit 416a and a second bit 416b. A pair of MLC cells 412a, 412b may belong to a page 408 of the MLC block 404. Since each page 408 may comprise eight bits, there may be two pairs of MLC cells 412a, 412b provided per page 408. In accordance with at least some embodiments, a pair of MLC cells 412a, 412b may be used to store three bits of data. When a pair of MLC cells 412a, 412b are used to store three bits of data, an efficiency rate of 3/4 is achieved for the memory device 128. This means that 3/4 of the possible data storage locations in the memory array 304 are used for actually storing data. While some memory density efficiency is given up, the advantage to using the coding format described herein is that each page 408a, 408b, 408c will have its own single threshold. In other words, data can be read from any page in the MLC block 404 using a single voltage threshold, which greatly reduces the read latency. Instead of having to apply three different voltage thresholds to read data from each page 408, embodiments of the present disclosure enable a read efficiency that is three times faster than if all of the data storage locations were used.

In some embodiments, the pair of MLC cells 412a, 412b used to store three bits of data are physically adjacent to one another in a page (and in the array 304). The pair of MLC cells 412a, 412b may have data written thereto substantially simultaneously so that there is no difference in environmental or process conditions when the data is written to each of the MLC cells 412a, 412b. This helps enable a read operation from the pair of MLC cells 412a, 412c with a single applied voltage.

In some embodiments, the first bit 416a in an MLC cell 412 may correspond to a most significant bit and the second bit 416b in the MLC cell 412 may correspond to a least significant bit. Alternatively, the first bit 416a in the MLC cell 412 may correspond to the least significant bit and the second bit 416b in the MLC cell 412 may correspond to the most significant bit. When data is written to the pair of MLC cells 412a, 412b any combination of the bits in the cells may be used to store the three bits of data written thereto. More specifically, the three bits of data written to the pair of MLC cells 412a, 412b may be written to the first and second bits 416a, 416b of the first MLC cell 412a and one of the other bits (e.g., the first bit 416a or second bit 416b) in the second MLC cell 412a. Alternatively, the three bits of data written to the pair of MLC cells 412a, 412b may be written to one of the bits in the first MLC cell 412a and both bits of the second MLC cell 412b.

As discussed above, when data is written to the flash memory device 128, all pages 408a, 408b, 408c may be encoded together and written together. By enforcing this writing requirement on the flash memory device 128, the write latency may be increased and may necessitate the use of the write cache 144. However, the increase of write latency may be tolerable given the advantage of significantly reduced read latency. Specifically, a single applied threshold can be used to read data from an entire page of the flash memory device 128.

As shown in FIGS. 4C and 4D, when data is read from the flash memory device 128, a page of data can be recovered by applying a single voltage to the word line. In operation, a selected voltage is applied to a selected word line and then the response of the cells in the word line is compared to the single voltage threshold. If the response from the cell(s) is above the threshold, then a first logic value is read out (e.g., a logical '1') whereas if the response from the cell(s) is below the threshold, then a second logic value is read out (e.g., a logical '0'). As can be appreciated, if the response voltage is equal to the threshold voltage, then the logical value assigned to that response may be either a logical '1' or logical '0' depending upon design preferences.

A selected page can be read and decoded independently of all other pages without the need of applying multiple voltages to the word line as in prior art flash memory systems. In the MLC flash example, each pair of MLC cells 412a, 412b will have eight possible states. With this fact, and as can be seen in the table 420 of FIG. 4C and the plot 424 of FIG. 4D, a single voltage can be used to read data from any of the pages 408a, 408b, 408c. As an example, an applied voltage threshold of T1=00, T2=01, and T3=11 can be used to read user data 000 from pages P1, P2, and P3 of media CB, respectively. As another example, an applied voltage threshold of T1=01, T2=01, and T3=01 can be used to read user data 101 from pages P1, P2, and P3 of media DA, respectively.

With reference now to FIGS. 5A-D, a memory device 128 utilizing TLC flash memory will be described in accordance with at least some embodiments of the present disclosure. The memory device 128 may comprise TLC blocks 504 having seven pages 508a-g contained therein. In TLC example, a single word line would store seven pages, each independently readable. The encoding process may carry some overhead. For example a TLC flash device may be organized into pages of 8448 cells capable of storing three pages of 8448 bits each. Using an embodiment described herein the same flash device would store six pages of 2112 bits each and an additional page of 4228 bits. Overall only 16896 bits would be stored equivalent to 2 bits per cell. However the read latency for this device would be comparable to a SLC flash device.

In particular, the TLC cells 512a, 512b, 512c, 512d contained in a page 508 of a TLC block 504 may be grouped into sets of four TLC cells. The bits 516a, 516b, 516c, from each the four TLC cells 512a, 512b, 512c, 512d may be used to store eight bits of data (e.g., the set of TLC cells may have eight possible states). This would provide a storage efficiency rate of 8/12 or 2/3. While some storage efficiency is sacrificed in this TLC flash memory, the read latency for obtaining data from a page 508 of the TLC flash memory would be similar to reading data from an SLC flash device since only a single voltage would need to be applied.

Figure 5D:
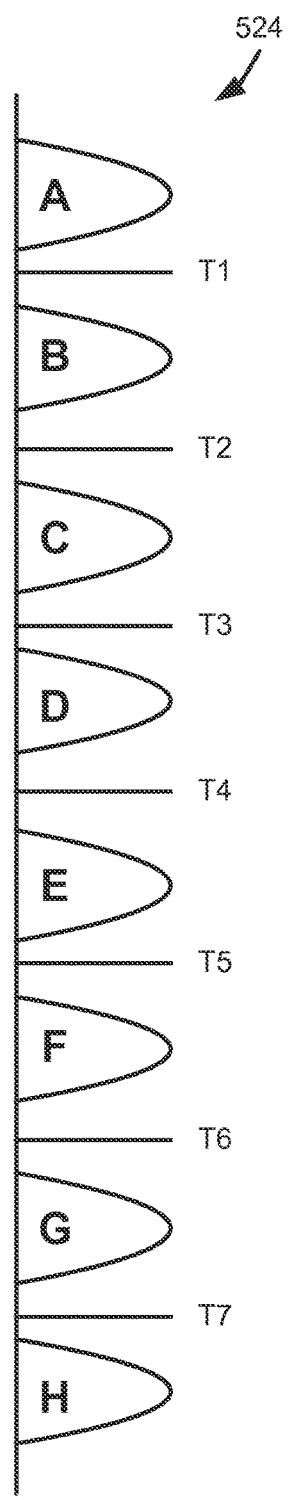
FIG. 5D is a plot of cell voltage distributions for reading data from a TLC flash memory device in accordance with at least some embodiments of the present disclosure.

As can be seen in FIGS. 5C and 5D, a page of data can be recovered by applying a single voltage to the word line. A selected page can be read and decoded independently of all other pages without the need of applying multiple voltages to the word line as in prior art flash memory systems. With this fact, and as can be seen in the table 520 of FIG. 5C and the plot 524 of FIG. 5D, a single voltage can be used to read data from any of the pages 508a-g. It should be appreciated that the illustrated table 520 only corresponds to a portion of the total table used to read data from the TLC flash memory. As an example, an applied voltage threshold of T1=0000, T2=0001, T3=0001, T4=0101, T5=0101, T6=0111, and T7=0111 may be used to read user data 0000000 from the pages of media AECG, respectively.

Figure 6:
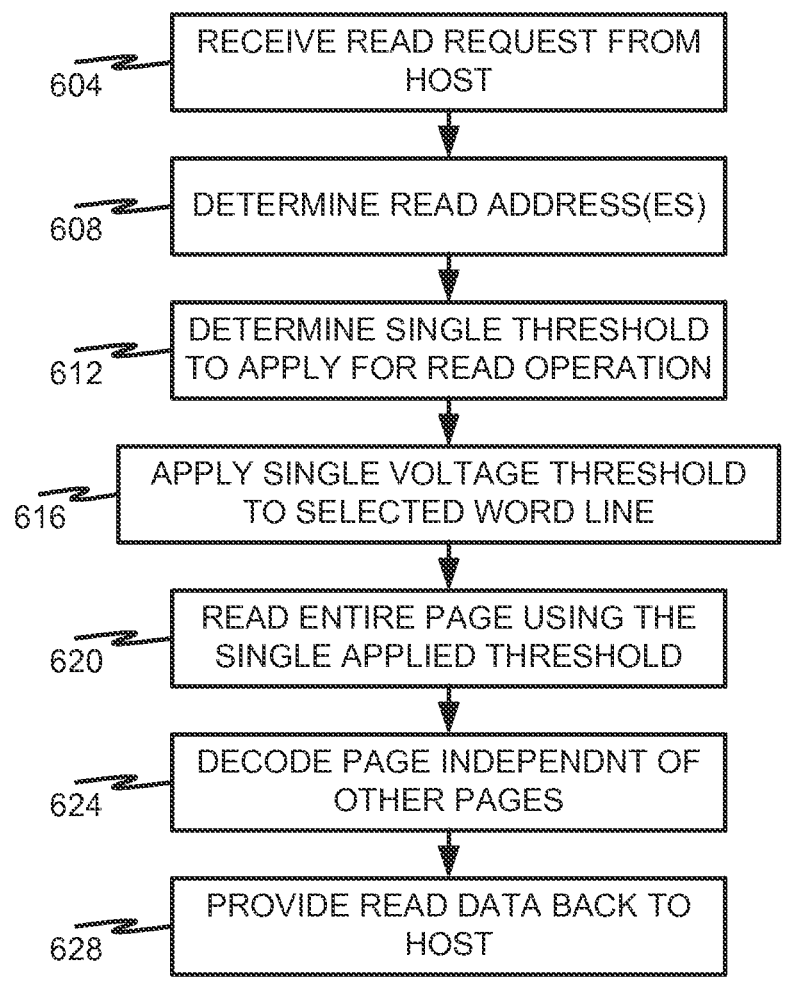
FIG. 6 is a flow diagram depicting a method of reading data from a multi-level flash storage device in accordance with at least some embodiments of the present disclosure.

With reference now to FIG. 6, an illustrative method of reading data from a flash memory device 128 will be described in accordance with at least some embodiments of the present disclosure. The method begins when a read request is received at the controller 104 from a host 124 (step 604). Upon receiving the read request, the controller 104 initiates its read logic 116 and determines an address or set of addresses from which data will be read from the flash memory device 128 (step 608).

In addition to determining the read address(es), the read logic 116 is also used to determine a single threshold to apply to the flash memory device 128 to execute the read operation (step 612). In some embodiments, the single voltage may be determined by determining the page(s) from which the data will be read and determining the single threshold for obtaining data from the desired page(s). This may be done by referencing the read table 420, 520 or by testing the page to determine the single threshold. Testing the page may be accomplished by turning on all data storage elements (e.g., transistors) except for the one from the page to be read. For that selected page, a specific voltage can be applied to determine the threshold voltage to be used for reading data from that page.

The single voltage is then applied to the selected word line (step 616) to obtain data from the entire page (step 620). Specifically, since the multi-level cells (e.g., MLC, TLC, QLC) were encoded in such a way that pairs or groups of the cells have a specific number of possible states, the entire page can be read using the single applied threshold. This facilitates an extremely fast read operation between the controller 104 and flash memory device 128.

The single voltage is applied to the flash memory device 128 and the data is obtained from the flash memory device 128 via the sample and hold circuitry 316. The data from the selected page is decoded independent of the other pages in the flash memory device 128 (step 624). Once the data is decoded by the controller 104, the data may then be provided to the requesting host 124 via the host bus interface 132 (step 628).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A memory system, comprising:
   a flash memory array having a plurality of memory cells that store data therein, each of the plurality of memory cells being organized into pages on different media of the flash memory array; and
   a controller configured to read a page of a selected one of the different media by applying a single threshold voltage to the flash memory array,
   wherein a combination of at least two of the plurality of memory cells is assigned to one of multiple possible states to store the data,
   wherein the controller reads the page of the selected one of the different media with the single threshold voltage that corresponds to one of multiple possible threshold voltages associated with the multiple possible states, and
   wherein the controller selects the single threshold voltage from a table that contains a mapping of the multiple threshold voltages to the pages of the different media such that the single threshold voltage for reading the page varies based on which of the different media is the selected one of the different media.

2. The memory system of claim 1, wherein each of the multiple possible threshold voltages are represented in the table by at least two bits, wherein the plurality of memory cells comprise Multi-Level Cells (MLCs), wherein the data is multi-bit data, and wherein the flash memory array is organized into at least three pages.

3. The memory system of claim 2, wherein each of the at least three pages has its own threshold voltage that is used to read data therefrom.

4. The memory system of claim 2, wherein the combination of the at least two of the plurality of memory cells is a first MLC cell and a second MLC cell that collectively store no more than three bits.

5. The memory system of claim 4, wherein the multiple possible states are eight possible states, wherein the multiple possible threshold voltages are three possible threshold voltages, and wherein the controller is configured to read the no more than three bits stored in the first MLC cell and the second MLC cell with the single threshold voltage that corresponds to one of the three possible threshold voltages.

6. The memory system of claim 1, wherein the plurality of memory cells comprise Triple-Level Cells (TLCs) such that the combination of the at least two of the plurality of memory cells is a combination of at least four of the plurality of memory cells, and wherein the flash memory array is organized into at least seven pages.

7. The memory system of claim 6, wherein each of the at least seven pages has its own threshold voltage that is used to read data therefrom.

8. The memory system of claim 6, wherein the combination of the at least four of the plurality of memory cells is a first TLC cell, a second TLC cell, a third TLC cell, and a fourth TLC cell that collectively store no more than eight bits.

9. The memory system of claim 8, wherein the multiple possible states are twelve possible states, wherein the multiple possible threshold voltages are seven possible threshold voltages, and wherein the controller is configured to read the no more than eight bits stored in the first TLC cell, the second TLC cell, the third TLC cell, and the fourth TLC cell with the single threshold voltage that corresponds to one of the seven possible threshold voltages.

10. The memory system of claim 1, wherein the flash memory array comprises a NAND flash memory array.

11. A non-volatile solid-state memory, comprising:
a plurality of memory cells that store data therein, each of the plurality of memory cells being organized into pages on different media of the non-volatile solid-state memory,
wherein each page of a selected one of the different media is readable with a single threshold value,
wherein a combination of at least two of the plurality of memory cells is assigned to one of multiple possible states to store the data,
wherein each page is readable with the single threshold value that corresponds to one of multiple possible threshold values associated with the multiple possible states,
wherein the multiple possible threshold values are mapped to the pages of the different media in a table such that the single threshold value for reading each page varies based on which of the different media is the selected one of the different media, and
wherein each of the multiple possible threshold values are represented in the table by at least two bits.

12. The memory of claim 11, wherein the plurality of memory cells comprise Multi-Level Cells (MLCs), and wherein the data is multi-bit data.

13. The memory of claim 12, wherein the plurality of memory cells are organized into at least three pages, each of which has its own threshold value that is used to read data therefrom.

14. The memory of claim 13, wherein the combination of the at least two of the plurality of memory cells is a first MLC cell and a second MLC cell that collectively store no more than three bits.

15. The memory of claim 14, wherein the multiple possible states are eight possible states, wherein the multiple possible threshold values are three possible threshold values, and wherein the three bits stored in the combination of the first MLC cell and the second MLC cell are readable with the single threshold value that corresponds to one of the three possible threshold values.

16. The memory of claim 11, wherein the plurality of memory cells comprise Triple-Level Cells (TLCs) such that the combination of the at least two of the plurality of memory cells is a combination of at least four of the plurality of memory cells.

17. The memory of claim 16, wherein the plurality of memory cells are organized into at least seven pages, each of which has its own threshold value that is used to read data therefrom.

18. The memory of claim 17, wherein the combination of the at least four of the plurality of memory cells is a first TLC cell, a second TLC cell, a third TLC cell, and a fourth TLC cell in the plurality of memory cells collectively store no more than eight bits.

19. The memory of claim 18, wherein the multiple possible states are twelve possible states, wherein the multiple possible threshold values are seven possible threshold values, and wherein the eight bits stored in the first TLC cell, the second TLC cell, the third TLC cell, and the fourth TLC cell are readable with the single threshold value that corresponds to one of the seven possible threshold values.

20. A method, comprising:
receiving a request to read data from a page of a selected one of different media of a flash memory array, the flash memory array including a plurality of memory cells;
determining a single voltage threshold to apply in connection with the request;
applying the single voltage threshold to a word line of the selected one of the different media in the flash memory array; and
reading an entirety of the page using the single applied voltage threshold,
wherein a combination of at least two of the plurality of memory cells is assigned to one of multiple possible states to store the data,
wherein the reading includes reading the page with the single voltage threshold that corresponds to one of multiple possible voltage thresholds associated with the multiple possible states, and
wherein the determining the single voltage threshold includes selecting the single voltage threshold from a table that contains a mapping of the multiple possible voltage thresholds to the pages of the different media such that the single voltage threshold for reading the page varies based on which of the different media is the selected one of the different media.

* * * * *